(12) United States Patent
Amparan et al.

(10) Patent No.: US 7,023,890 B2
(45) Date of Patent: Apr. 4, 2006

(54) DIGITAL OPTICAL SOURCING AND METHODS OF OPERATING A DIGITAL OPTICAL SOURCE

(76) Inventors: Alfonso Benjamin Amparan, 2840 Eagle Dr., Fort Collins, CO (US) 80526; David Lee Gines, 1520 River Oak Dr., Fort Collins, CO (US) 80525

( * ) Notice: Subject to any disclaimer, the term of this patent is extended or adjusted under 35 U.S.C. 154(b) by 250 days.

(21) Appl. No.: 10/173,056

(22) Filed: Jun. 17, 2002

(65) Prior Publication Data
US 2003/0231677 A1 Dec. 18, 2003

(51) Int. Cl.
*H01S 3/00* (2006.01)

(52) U.S. Cl. .................... 372/38.1; 372/38.02
(58) Field of Classification Search ............... 372/38.1
See application file for complete search history.

(56) References Cited

U.S. PATENT DOCUMENTS

| | | | |
|---|---|---|---|
| 5,621,560 A * | 4/1997 | Wood | 398/183 |
| 5,793,782 A | 8/1998 | Meyrueix | |
| 5,917,637 A * | 6/1999 | Ishikawa et al. | 398/197 |
| 6,031,851 A | 2/2000 | Shimizu et al. | |
| 6,034,801 A * | 3/2000 | Pfeiffer | 398/191 |
| 6,320,688 B1 * | 11/2001 | Westbrook et al. | 398/194 |

FOREIGN PATENT DOCUMENTS

JP 6 326391 3/1995

* cited by examiner

*Primary Examiner*—Minsun Oh Harvey
*Assistant Examiner*—Dung Nguyen

(57) ABSTRACT

Digital optical sources and methods of operating the same are described. In one aspect, a digital optical source includes a laser, an optical intensity modulator, and a drive circuit. The laser is operable to generate light of higher output optical power in a high output power mode and to generate light of lower output optical power in a low output power mode. The optical intensity modulator is coupled to receive light from the laser and is operable to intensity modulate the received laser light less in a high output power mode and to intensity modulate the received laser light more in a low output power mode. The drive circuit is coupled to the laser and the optical intensity modulator and is configured so that the laser and the optical intensity modulator are operated synchronously in high output power modes and in low output power modes.

20 Claims, 2 Drawing Sheets

DIGITAL OPTICAL SOURCING AND METHODS OF OPERATING A DIGITAL OPTICAL SOURCE

BACKGROUND

A digital optical source typically includes a source of laser light that is modulated to generate optical pulse trains representing digital information. Two general approaches typically are used to intensity modulate laser light in a digital optical source: direct modulation and external modulation.

In a direct modulation approach, a laser (e.g., a laser diode) is directly modulated by an information signal to generate a modulated laser output. The laser output power often is modulated directly by modulating the input drive current to the laser. The laser begins lasing when the drive current exceeds a threshold current level. Typically, the modulation range of input drive current that is applied to a directly modulated laser extends above and below the threshold current level.

In an external modulation approach, a modulator modulates light intensity generated by a continuous wave laser in accordance with an information signal. The modulator and laser may be disposed on separate, discrete substrates or they may be fabricated together on a single substrate. External modulators fall into two main families: electro-optic type modulators, such as Mach-Zehnder type electro-optic modulators, which modulate light through destructive interference; and electroabsorptive modulators, which absorb light through the Quantum Confined Stark Effect (QCSE). The absorption spectrum of an electroabsorptive modulator depends on the drive voltage across the modulator. For example, some modulators are transparent with no drive voltage and are opaque with an applied voltage. Thus, with these types of modulators a continuous wave laser may be modulated to a digital bit stream by varying the drive voltage across the modulator.

Direct laser modulation works well at bit rates up to approximately 1 GHz. At higher modulation frequencies, however, nonlinear effects within the laser create chirp. Chirp is a variation in optical signal wavelength over the duration of a laser light pulse during modulation. For positive transient chirp, the leading edge of the laser light pulse comprises shorter wavelengths than the trailing edge. In positive dispersion fibers, shorter wavelengths travel faster than longer wavelengths. The pulse therefore broadens as it propagates. Regenerators often are required in order to compensate for this positive chirp, raising the cost of communications networks considerably. For this reason, direct modulation of lasers typically is not used at high bit rates, especially when the laser is driven to create sharp laser pulses with abrupt rising and falling edges.

External modulation is favored for applications that are sensitive to chirp, such as long-distance digital optical communications, where the excessive spectral broadening in the emitted modulated light due to chirp leads to a greater pulse distortion during propagation and a reduction in overall performance. Optical signal modulation via external electroabsorptive modulators commonly is used because this mechanism introduces very little chirp into the output signal. The main disadvantage of external modulation, however, is low extinction ratio of the output optical signal. Larger extinction ratios require highly modulated electrical drive signals, requiring very high electrical power. The extinction ratio and related signal-to-noise ratio often are limiting factors in external modulation approaches.

SUMMARY

In one aspect, the invention features a digital optical source that comprises a laser, an optical intensity modulator, and a drive circuit. The laser is operable to generate light of higher output optical power in a high output power mode and to generate light of lower output optical power in a low output power mode. The optical intensity modulator is coupled to receive light from the laser and is operable to intensity modulate the received laser light less in a high output power mode and to intensity modulate the received laser light more in a low output power mode. The drive circuit is coupled to the laser and the optical intensity modulator and is configured so that the laser and the optical intensity modulator are operated synchronously in high output power modes and in low output power modes.

In another aspect, the invention features a digital optical sourcing method. In accordance with this inventive method, laser light of higher output optical power is generated in a high output power mode and laser light of lower output optical power is generated in a low output power mode. The laser light is synchronously intensity modulated less when the laser light is generated in the high output power mode and the laser light is synchronously intensity modulated more when the laser light is generated in the low output power mode.

In another aspect of the invention, a digital optical source is operated as follows. The digital optical source includes a laser that is operable to generate light of higher output optical power in a high output power mode and to generate light of lower output optical power in a low output power mode. The digital optical source also includes an optical intensity modulator that is coupled to receive light from the laser and is operable to intensity modulate the received laser light less in a high output power mode and to intensity modulate the received laser light more in a low output power mode. The laser and the optical intensity modulator are operated synchronously in high output power modes and in low output power modes.

Other features and advantages of the invention will become apparent from the following description, including the drawings and the claims.

DETAILED DESCRIPTION

In the following description, like reference numbers are used to identify like elements. Furthermore, the drawings are intended to illustrate major features of exemplary embodiments in a diagrammatic manner. The drawings are not intended to depict every feature of actual embodiments nor relative dimensions of the depicted elements, and are not drawn to scale.

Figure 1:
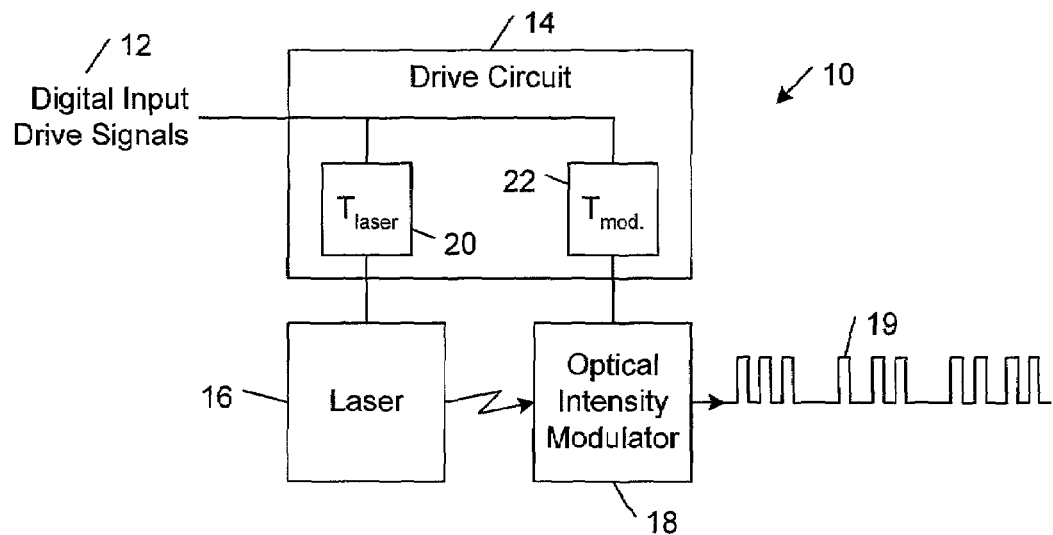
FIG. 1 is a block diagram of a digital optical source that includes a drive circuit, a laser, and an optical intensity modulator that is coupled in series with the laser.

Referring to FIG. 1, in one embodiment, a digital optical source 10 includes a drive circuit 14, a laser 16, and an optical intensity modulator 18. Digital optical source 10 may be driven by an external digital signal source, such as a non-return to zero (NRZ) driver, that is operable to transmit digital input drive signals 12 to drive circuit 14. The digital impulse output 19 that is generated by digital optical source 10 may be encoded in accordance with any one of a wide variety of known optical communication protocols (e.g., amplitude shift keying (ASK) modulation, frequency shift keying (FSK) modulation, phase shift keying (PSK) modulation, and the like). In some embodiments, digital optical source 10 is operable to generate digital impulse output 19 at bit rates of approximately 1 GHz, or greater.

Drive circuit 14 includes respective sets 20, 22 of conventional RF components (e.g., attenuators, filters, and couplers) that are configured to modify the digital input drive signals 12 with respective transfer functions $T_{laser}$, $T_{mod}$, and to synchronously apply the modified drive signals to the laser 16 and the optical intensity modulator 18. As explained in detail below, the transfer functions $T_{laser}$, $T_{mod}$ may define system responses that pass synchronous drive signals that substantially track each other, or they may define system responses that pass synchronous drive signals that are substantially inverted relative to each other. Drive circuit 14 also may include circuit elements for establishing appropriate direct current (DC) bias conditions for operating the laser 16 and the optical intensity modulator 18.

Laser 16 may be a conventional source of laser light and optical intensity modulator 18 may be any one of a wide variety of different optical intensity modulators, including an electro-optic modulator and an electro-absorptive modulator. The laser 16 and the optical intensity modulator 18 may be disposed on separate, discrete substrates or they may be fabricated together on a single substrate. In some embodiments, laser 16 is implemented as a semiconductor laser (e.g., a multi-quantum well distributed feedback semiconductor laser) and optical intensity modulator is implemented as a semiconductor electro-absorptive modulator (e.g., a multi-quantum well electro-absorptive modulator). In these embodiments, laser 16 and optical intensity modulator 18 preferably are fabricated on the same semiconductor chip.

Figure 2:
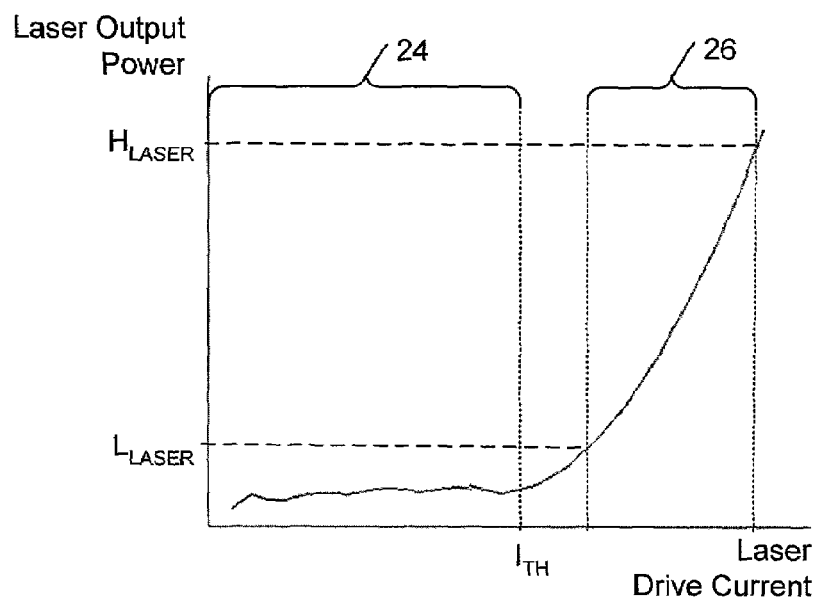
FIG. 2 is a diagrammatic graph of laser output power plotted as a function of drive current applied to the laser of FIG. 1.

As shown diagrammatically in FIG. 2, the output optical power generated by a laser varies nonlinearly with the drive current that is applied by drive circuit 14. In particular, the output optical power plot is characterized by a non-lasing regime 24 that extends from a drive current level of zero to a lasing threshold current level ($I_{TH}$), and a linear lasing regime 26 that covers a range of drive current levels just above the lasing threshold ($I_{TH}$). As explained in detail below, in some embodiments, the drive circuit 14 switches laser 16 between a high output power mode ($H_{laser}$) and a low output power mode ($L_{laser}$), both of which preferably are above the lasing threshold ($I_{TH}$). In some of these embodiments, the high output power mode ($H_{laser}$) and the low output power mode ($L_{laser}$) preferably are both within the linear lasing regime 26.

Figure 3:
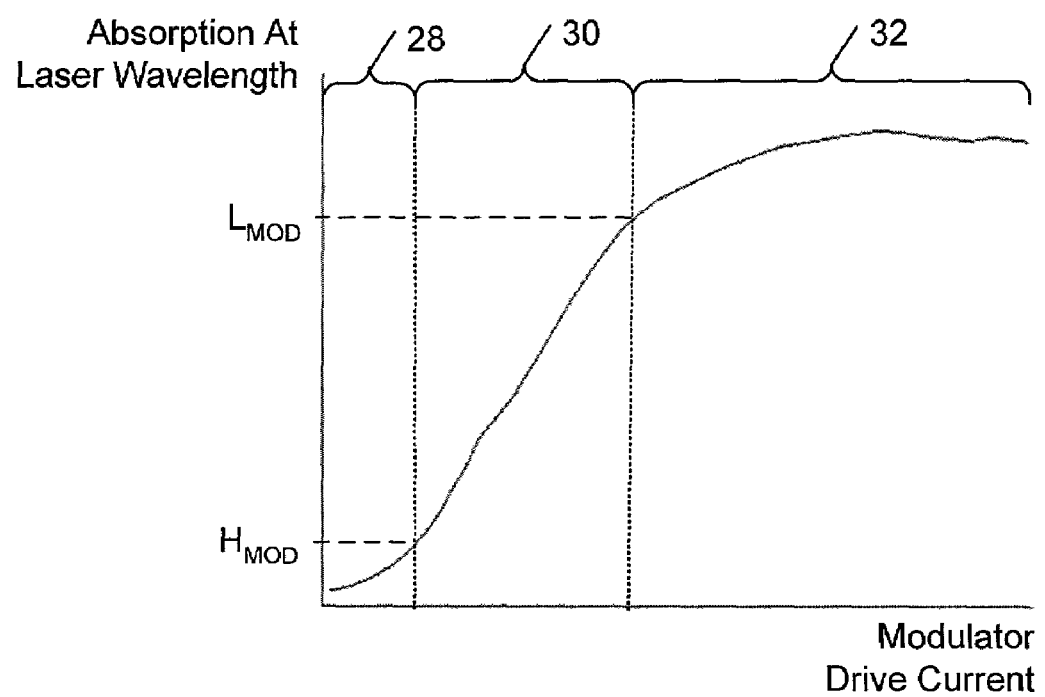
FIG. 3 is a diagrammatic graph of laser light absorption by an electro-absorptive implementation of the optical intensity modulator of FIG. 1 plotted as a function of applied drive voltage.

As shown diagrammatically in FIG. 3, the absorptivity of a semiconductor electro-absorptive modulator varies with the drive voltage that is applied by drive circuit 14. In particular, the absorption plot is characterized by a transmissive regime 28, a linear modulation regime 30, and a high absorption regime 32. As explained in detail below, in some embodiments, optical intensity modulator 18 is switched between a high output power mode ($H_{mod}$) in which the intensity of the received laser light is modulated less, and a low output power mode ($L_{mod}$) in which the intensity of the received laser light is modulated more. The high and low output power modes ($H_{mod}$, $L_{mod}$) preferably are both within the linear modulation regime.

In the illustrated embodiments, laser 16 and optical intensity modulator 18 may be operated synchronously in high output power modes ($H_{laser}$, $H_{mod}$) and low output power modes ($L_{laser}$, $L_{mod}$) in accordance with the digital input drive signals 12. In other words, the optical intensity modulator 18 is driven synchronously with the laser 16 such that when the laser 16 is driven at full power ($H_{laser}$), the modulator 18 is substantially transparent ($H_{mod}$), maximizing the output power. When the laser output is decreased ($L_{laser}$), the optical intensity modulator 18 is substantially opaque ($L_{mod}$) to the incident laser light, minimizing the output power. In the illustrated embodiments, laser 16 operates in a high output power mode ($H_{laser}$) in response to a high drive signal and in a low output power mode ($L_{laser}$) in response to a low drive signal, whereas optical intensity modulator 18 operates in a high output power mode ($H_{mod}$) in response to a low drive signal and in a low output power mode ($L_{mod}$) in response to a high drive signal. Accordingly, in these embodiments, the drive signals that are delivered to the laser 16 are substantially inverted with respect to the corresponding drive signals that are synchronously delivered to the optical intensity modulator 18.

In general, laser chirp is reduced when a laser is modulated in a linear regime rather than above and below the lasing threshold. In the above-described embodiments, laser 16 and optical intensity modulator 18 may be operated within their linear regimes so that power requirements may be reduced and chirp may be reduced, while obtaining extinction ratios that are comparable to direct modulation of the laser above and below the lasing threshold. In particular, chirp may be reduced significantly by operating laser 16 within its linear regime. The relatively poor extinction ratio characteristic of such laser operation, however, may be improved to achieve extinction ratios that are comparable to direct modulation of the laser above and below the lasing threshold by operating the external modulator 18 synchronously with laser 16.

Other embodiments are within the scope of the claims.

For example, although the above embodiments are described primarily in connection with electro-absorptive type optical intensity modulators, these embodiments also may be readily implemented using any kind of optical intensity modulator, including electro-optic type optical intensity modulators.

What is claimed is:

1. A digital optical source, comprising: a laser operable to generate light of higher output optical power in a high output power mode and to generate light of lower output optical power in a low output power mode; an optical intensity modulator coupled to receive light from the laser and being operable to modulate the intensity of the received laser light less in a high output power mode and to modulate the intensity of the received laser light more in a low output power mode; and a drive circuit coupled to the laser and the optical intensity modulator and configured so that the laser and the optical intensity modulator are operated synchronously in high output power modes and in low output power modes.

2. The digital optical source of claim 1, wherein the laser is a semiconductor laser.

3. The digital optical source of claim 2, wherein the optical intensity modulator is integrated with the semiconductor laser on a single monolithic semiconductor chip.

4. The digital optical source of claim 1, wherein the optical intensity modulator is an electroabsorption modulator.

5. The digital optical source of claim 1, wherein the optical intensity modulator is an electro-optic modulator.

6. The digital optical source of claim 1, wherein the drive circuit is configured to synchronously deliver respective drive signals to the laser and the optical intensity modulator.

7. The digital optical source of claim 6, wherein the optical intensity modulator operates in a high output power mode in response to a low drive signal and in a low output power mode in response to a high drive signal.

8. The digital optical source of claim 7, wherein the drive signals delivered to the laser are substantially inverted with respect to corresponding drive signals synchronously delivered to the optical intensity modulator.

9. The digital optical source of claim 1, further comprising a digital signal source coupled by the drive circuit to the laser and the optical intensity modulator.

10. The digital optical source of claim 1, wherein the drive circuit is configured to drive the laser in high and low output power modes that are both above a lasing threshold of the laser.

11. The digital optical source of claim 10, wherein the drive circuit is configured to drive the laser in high and low output power modes that are both within a linear lasing regime of the laser.

12. The digital optical source of claim 1, wherein the drive circuit is configured to drive the optical intensity modulator in high and low output power modes that are both within a linear modulation regime of the optical intensity modulator.

13. A digital optical sourcing method, comprising: generating laser light of higher output optical power in a high output power mode and generating laser light of lower output optical power in a low output power mode; and synchronously modulating the intensity of the laser light less when the laser light is generated in the high output power mode and synchronously modulating the intensity of the laser light more when the laser light is generated in the low output power mode.

14. A method of operating a digital optical source, comprising: providing a digital optical source comprising a laser operable to generate light of higher output optical power in a high output power mode and to generate light of lower output optical power in a low output power mode, and an optical intensity modulator coupled to receive light from the laser and being operable to modulate the intensity of the received laser light less in a high output power mode and to modulate the intensity of the received laser light more in a low output power mode; and synchronously operating the laser and the optical intensity modulator in high output power modes and in low output power modes.

15. The method of claim 14, wherein operating the laser and the optical intensity modulator comprises synchronously delivering respective drive signals to the laser and the optical intensity modulator.

16. The method of claim 15, wherein the optical intensity modulator operates in a high output power mode in response to a low drive signal and in a low output power mode in response to a high drive signal, and the drive signals delivered to the laser are substantially inverted with respect to corresponding drive signals synchronously delivered to the optical intensity modulator.

17. The method of claim 14, wherein the laser is operated in high and low output power modes that are both above a lasing threshold of the laser.

18. The method of claim 17, wherein the laser is operated in high and low output power modes that are both within a linear lasing regime of the laser.

19. The method of claim 14, wherein the optical intensity modulator is operated in high and low output power modes that are both within a linear modulation regime of the optical intensity modulator.

20. The method of claim 14, wherein the laser and the optical intensity modulator are operated synchronously at a bit rate of approximately 1 GHz, or greater.

* * * * *